United States Patent
Zhao et al.

(10) Patent No.: US 11,355,668 B2
(45) Date of Patent: Jun. 7, 2022

(54) PHOTONIC MATERIALS

(71) Applicant: Ohio State Innovation Foundation, Columbus, OH (US)

(72) Inventors: Hongping Zhao, Columbus, OH (US); Md Rezaul Karim, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 70 days.

(21) Appl. No.: 16/763,356

(22) PCT Filed: Nov. 12, 2018

(86) PCT No.: PCT/US2018/060571
§ 371 (c)(1),
(2) Date: May 12, 2020

(87) PCT Pub. No.: WO2019/094866
PCT Pub. Date: May 16, 2019

(65) Prior Publication Data
US 2020/0295226 A1    Sep. 17, 2020

Related U.S. Application Data

(60) Provisional application No. 62/585,079, filed on Nov. 13, 2017.

(51) Int. Cl.
*H01L 33/06* (2010.01)
*H01L 33/26* (2010.01)
*H01L 33/32* (2010.01)

(52) U.S. Cl.
CPC .............. *H01L 33/06* (2013.01); *H01L 33/26* (2013.01); *H01L 33/32* (2013.01)

(58) Field of Classification Search
CPC .......... H01L 33/06; H01L 33/26; H01L 33/32
See application file for complete search history.

(56) References Cited

U.S. PATENT DOCUMENTS 5,408,487 A    4/1995   Uchida et al.
2013/0240026 A1*  9/2013   Atwater ............ H01L 21/02458
                                                     136/255

FOREIGN PATENT DOCUMENTS

CN           1929153 A         3/2007

OTHER PUBLICATIONS

Lu Han, Kathleen Kash, and Hongping Zhao, Designs of blue and green light-emitting diodes based on type-II InGaN—ZnGeN2 quantum wells, Journal of Applied Physics 120, 103102 (2016) (Year: 2016).*

(Continued)

*Primary Examiner* — Mark W Tornow
(74) *Attorney, Agent, or Firm* — Meunier Carlin & Curfman LLC (57) ABSTRACT

Disclosed herein are photonic materials. The photonic materials can comprise: a first layer comprising $In_xGa_{1-x}N$, wherein x is from 0 to 0.5; a second layer comprising $ZnSnN_2$; and a third layer comprising $In_yGa_{1-y}N$, wherein y is from 0 to 0.5; wherein the second layer is disposed between and in contact with the first layer and the third layer, such that the second layer is sandwiched between the first layer and the third layer. In some examples, the photonic materials can be sandwiched between two or more barrier layers to form a quantum well.

20 Claims, 10 Drawing Sheets

(56) References Cited

OTHER PUBLICATIONS

Aaron D. Martinez, Angela N. Fioretti, Eric S. Toberer, and Adele C. Tamboli, "Synthesis, structure, and optoelectronic properties of II-IV-V2 materials,"J. Mater. Chem. A, 2017, 5, 11418-11435 (Year: 2017).*

N. Feldberg et al., "ZnSnN2: A new earth-abundant element semiconductor for solar cells," 2012 38th IEEE Photovoltaic Specialists Conference, 2012, pp. 002524-002527 (Year: 2012).*

N. Feldberg, J. D. Aldous, W. M. Linhart, L. J. Phillips, K. Durose, P. A. Stampe, R. J. Kennedy, D. O. Scanlon, G. Vardar, R. L. Field III, T. Y. Jen, R. S. Goldman, T. D. Veal, and S. M. Durbin , "Growth, disorder, and physical properties of ZnSnN2", Appl. Phys. Lett. 103, 042109 (2013) (Year: 2013).*

Arif RA et al. "Type-II InGaN—GaNAs quantum wells for lasers applications," Appl. Phys. Lett., 2008, 92, 011104.

Department of Energy Solid-State Lighting R&D Plan, Jun. 2016, 208 pages.

Keller S et al. "Recent progress in metal-organic chemical vapor deposition of (0001) N-polar group-III nitrides," Semicond. Sci. Technol., 2014, 29, 113001.

Kim KC et al., "Improved electroluminescence on nonpolar m-plane InGaN/GaN quantum wells LEDs," Physica Status Solidi (RRL), 2007, 1, 125-127.

Zhao H. "Approaches for high internal quantum efficiency green InGaN light-emitting diodes with large overlap quantum wells," Opt. Express, 2011, 19, A991.

Zhao H. "Self-Consistent Analysis of Strain-Compensated InGaN—AlGaN Quantum Wells for Lasers and Light-Emitting Diodes," IEEE J. Quantum Electron., 2009, 45, 66.

Zhao H et al. "Analysis of InGaN-delta-InN quantum wells for light-emitting diodes," Appl. Phys. Lett., 2010, 97, 131114.

Lambrecht WRL et al. "Heterovalent ternary II-IV-N2 compounds: perspectives for a new class of wide-band-gap nitrides," Chapter 15 (pp. 519-585) in III-Nitride Semiconductors and Their Modern Devices, Edited by Bernard Gil, Oxford Science Publications, (Oxford University Press, Oxford, UK), 2013.

International Preliminary Report on Patentability issued for Application No. PCT/US2018/060571, dated May 28, 2020.

International Search Report and Written Opinion issued by the International Searching Authority (ISA/US) in PCT Application No. PCT/US2018/060571 dated Jan. 16, 2019. 8 pages.

Punya, A et al. Quasiparticle band structure of Zn—IV—N2 compounds, Physical Review B, 2011, 84, 165204.

Punya, A et al. Band offsets between ZnGeN2, GaN, ZnO, and SnSnN2 and their potential impact for solar cells, Physical Review B, 2013, 88, 075302.

* cited by examiner

PHOTONIC MATERIALS

CROSS-REFERENCE TO RELATED APPLICATIONS

This application is a national stage application filed under 35 U.S.C. § 371 of PCT/US2018/060571 filed Nov. 12, 2018, which claims the benefit of priority to U.S. Provisional Application No. 62/585,079, filed Nov. 13, 2017, both of which are hereby incorporated herein by reference in their entireties.

STATEMENT REGARDING GOVERNMENT SUPPORT

This invention was made with government support under grant number 1533957 awarded by the National Science Foundation. The government has certain rights in the invention.

BACKGROUND

Although extensive research has resulted in ~69% external quantum efficiency (EQE) of InGaN based blue light emitting diodes (LEDs), efficiency of the longer visible wavelength InGaN based light emitters has remained an issue. The compositions, methods, and systems discussed herein addresses these and other needs.

SUMMARY

In accordance with the purposes of the disclosed compositions, methods, and systems as embodied and broadly described herein, the disclosed subject matter relates to photonic materials and methods of use thereof.

Additional advantages of the disclosed systems and methods will be set forth in part in the description which follows, and in part will be obvious from the description. The advantages of the disclosed systems and methods will be realized and attained by means of the elements and combinations particularly pointed out in the appended claims. It is to be understood that both the foregoing general description and the following detailed description are exemplary and explanatory only and are not restrictive of the disclosed systems and methods, as claimed.

The details of one or more embodiments of the invention are set forth in the accompanying drawings and the description below. Other features, objects, and advantages of the invention will be apparent from the description and drawings, and from the claims.

BRIEF DESCRIPTION OF THE FIGURES

The accompanying figures, which are incorporated in and constitute a part of this specification, illustrate several aspects of the disclosure, and together with the description, serve to explain the principles of the disclosure.

DETAILED DESCRIPTION

The compositions, methods, and systems described herein may be understood more readily by reference to the following detailed description of specific aspects of the disclosed subject matter and the Examples included therein.

Before the present compositions, methods, and systems are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entirety's are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings.

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. By "about" is meant within 5% of the value, e.g., within 4, 3, 2, or 1% of the value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

Disclosed herein are photonic materials. The photonic materials comprise a first layer, a second layer, and a third layer, wherein the second layer is disposed between and in contact with the first layer and the third layer, such that the second layer is sandwiched between the first layer and the third layer.

The first layer comprises $In_xGa_{1-x}N$, wherein x can be 0 or more (e.g., 0.01 or more, 0.02 or more, 0.03 or more, 0.04 or more, 0.05 or more, 0.06 or more, 0.07 or more, 0.08 or more, 0.09 or more, 0.10 or more, 0.11 or more, 0.12 or more, 0.13 or more, 0.14 or more, 0.15 or more, 0.16 or more, 0.17 or more, 0.18 or more, 0.19 or more, 0.20 or more, 0.21 or more, 0.22 or more, 0.23 or more, 0.24 or more, 0.25 or more, 0.26 or more, 0.27 or more, 0.28 or more, 0.29 or more, 0.30 or more, 0.31 or more, 0.32 or more, 0.33 or more, 0.34 or more, 0.35 or more, 0.4 or more, or 0.45 or more). In some examples, x can be 0.5 or less (e.g., 0.45 or less, 0.4 or less, 0.35 or less, 0.34 or less, 0.33 or less, 0.32 or less, 0.31 or less, 0.30 or less, 0.29 or less, 0.28 or less, 0.27 or less, 0.26 or less, 0.25 or less, 0.24 or less, 0.23 or less, 0.22 or less, 0.21 or less, 0.20 or less, 0.19 or less, 0.18 or less, 0.17 or less, 0.16 or less, 0.15 or less, 0.14 or less, 0.13 or less, 0.12 or less, 0.11 or less, 0.10 or less, 0.09 or less, 0.08 or less, 0.07 or less, 0.06 or less, or 0.05 or less). The value of x can range from any of the minimum values described above to any of the maximum values described above. For example, x can be from 0 to 0.5 (e.g., from 0 to 0.25, from 0.25 to 0.5, from 0 to 0.15, from 0.15 to 0.25, from 0.25 to 0.35, from 0.35 to 0.5, from 0.05 to 0.5, from 0.5 to 0.4, from 0.05 to 0.35, or from 0.1 to 0.25). In some examples, the first layer consists of $In_xGa_{1-x}N$.

The first layer can have a first average thickness of 0.5 nm or more (e.g., 0.6 nm or more, 0.7 nm or more, 0.8 nm or more, 0.9 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.1 nm or more, 2.2 nm or more, 2.3 nm or more, 2.4 nm or more, 2.5 nm or more, 3 nm or more, 3.5 nm or more, or 4 nm or more). In some examples, the first layer can have a first average thickness of 5 nm or less (e.g., 4.5 nm or less, 4 nm or less, 3.5 nm or less, 3 nm or less, 2.5 nm or less, 2.4 nm or less, 2.3 nm or less, 2.2 nm or less, 2.1 nm or less, 2.0 nm or less, 1.9 nm or less, 1.8 nm or less, 1.7 nm or less, 1.6 nm or less, 1.5 nm or less, 1.4 nm or less, 1.3 nm or less, 1.2 nm or less, 1.1 nm or less, or 1.0 nm or less). The first average thickness of the first layer can range from any of the minimum values described above to any of the maximum values described above. For example, the first layer can have a first average thickness of from 0.5 nm to 5 nm (e.g., from 0.5 nm to 4.5 nm, from 0.5 nm to 4 nm, from 0.5 ran to 3.5 nm, from 0.5 nm to 3 nm, from 0.5 nm to 2.5 nm, from 1 nm to 2.5 nm, from 1.5 nm to 2.5 nm, from 1.6 nm to 2.4 nm, from 1.7 nm to 2.3 nm, from 1.8 nm to 2.2 nm, or from 1.9 nm to 2.1 nm).

The second layer comprises $ZnSnN_2$. In some examples, the second layer consists of $ZnSnN_2$.

The second layer can have a second average thickness of 0.1 nm or more (e.g., 0.2 nm or more, 0.3 nm or more, 0.4 nm or more, 0.5 nm or more, 0.6 nm or more, 0.7 nm or more, 0.8 nm or more, 0.9 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.1 nm or more, 2.2 nm or more, 2.3 nm or more, 2.4 nm or more, 2.5 nm or more, 2.6 nm or more, 2.7 nm or more, 2.8 nm or more, 2.9 nm or more, 3.0 nm or more, 3.5 nm or more, 4 nm or more, or 4.5 nm or more). In some examples, the second layer can have a second average thickness of 5 nm or less (e.g., 4.5 nm or less, 4 nm or less, 3.5 nm or less, 3.0 nm or less, 2.9 nm or less, 2.8 nm or less, 2.7 nm or less, 2.6 nm or less, 2.5 nm or less, 2.4 nm or less, 2.3 nm or less, 2.2 nm or less, 2.1 nm or less, 2.0 nm or less, 1.9 nm or less, 1.8 nm or less, 1.7 nm or less, 1.6 nm or less, 1.5 nm or less, 1.4 nm or less, 1.3 nm or less, 1.2 nm or less, 1.1 nm or less, 1.0 nm or less, 0.9 nm or less, 0.8 nm or less, 0.7 nm or less, 0.6 nm or less, or 0.5 nm or less). The second average thickness of the second layer can range from any of the minimum values described above to any of the maximum values described above. For example, the second layer can have a second average thickness of from 0.1 nm to 5 nm (e.g., from 0.1 nm to 4 nm, from 0.1 nm to 3 nm, from 0.1 nm to 2.5 nm, from 0.1 nm to 2.0 nm, from 0.1 nm to 1.5 nm, from 0.1 nm to 1.4 nm, from 0.1 nm to 1.3 nm, from 0.1 nm to 1.2 nm, from 0.3 nm to 1.1 nm, or from 0.4 nm to 1.0 nm).

The third layer comprises $In_yGa_{1-y}N$, wherein y can be 0 or more (e.g., 0.01 or more, 0.02 or more, 0.03 or more, 0.04 or more, 0.05 or more, 0.06 or more, 0.07 or more, 0.08 or more, 0.09 or more, 0.10 or more, 0.11 or more, 0.12 or more, 0.13 or more, 0.14 or more, 0.15 or more, 0.16 or more, 0.17 or more, 0.18 or more, 0.19 or more, 0.20 or more, 0.21 or more, 0.22 or more, 0.23 or more, 0.24 or more, 0.25 or more, 0.26 or more, 0.27 or more, 0.28 or more, 0.29 or more, 0.30 or more, 0.31 or more, 0.32 or more, 0.33 or more, 0.34 or more, 0.35 or more, 0.4 or more, or 0.45 or more). In some examples, y can be 0.5 or less (e.g., 0.45 or less, 0.4 or less, 0.35 or less, 0.34 or less, 0.33 or less, 0.32 or less, 0.31 or less, 0.30 or less, 0.29 or less, 0.28 or less, 0.27 or less, 0.26 or less, 0.25 or less, 0.24 or less, 0.23 or less, 0.22 or less, 0.21 or less, 0.20 or less, 0.19 or less, 0.18 or less, 0.17 or less, 0.16 or less, 0.15 or less, 0.14 or less, 0.13 or less, 0.12 or less, 0.11 or less, 0.10 or less, 0.09 or less, 0.08 or less, 0.07 or less, 0.06 or less, or 0.05 or less). The value of y can range from any of the minimum values described above to any of the maximum values described above. For example, y can be from 0 to 0.5 (e.g., from 0 to 0.25, from 0.25 to 0.5, from 0 to 0.15, from 0.15 to 0.25, from 0.25 to 0.35, from 0.35 to 0.5, from 0.05 to 0.5, from 0.05 to 0.4, from 0.05 to 0.35, or from 0.1 to 0.25). In some examples, the third layer consists of $In_yGa_{1-y}N$. In some examples, the value of x and y can be the same.

The third layer can have a third average thickness of 0.3 nm or more (e.g., 0.4 nm or more, 0.5 nm or more, 0.6 nm or more, 0.7 nm or more, 0.8 nm or more, 0.9 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.1 nm or more, 2.2 nm or more, 2.3 nm or more, 2.4 nm or more, 2.5 nm or more, 2.6 nm or more, 2.7 nm or more, 2.8 nm or more, 2.9 nm or more, 3.0 nm or more, 3.5 nm or more, 4.0 nm or more, or 4.5 nm or more). In some examples, the third layer can have a third average thickness of 5 nm or less (e.g., 4.5 nm or less, 4.0 nm or less, 3.5 nm or less, 3.0 nm or less, 2.9 nm or less, 2.8 nm or less, 2.7 nm or less, 2.6 nm or less, 2.5 nm or less, 2.4 nm or less, 2.3 nm or less, 2.2 nm or less, 2.1 nm or less, 2.0 nm or less, 1.9 nm or less, 1.8 nm or less, 1.7 nm or less, 1.6 nm or less, 1.5 nm or less, 1.4 nm or less, 1.3 nm or less, 1.2 nm or less, 1.1 nm or less, 1.0 nm or less, 0.9 nm or less, 0.8 nm or less, 0.7 nm or less, 0.6 nm or less, or 0.5 nm or less). The third average thickness of the third layer can range from any of the minimum values described above to any of the maximum values described above. For example, the third layer can have a third average thickness of from 0.3 nm to 5 nm (e.g., from 0.3 nm to 4 nm, from 0.3 nm to 3 nm, from 0.3 nm to 2.5 nm, from 0.3 nm to 2.0 nm, from 0.3 nm to 1.7 nm, 0.3 nm to 1.5 nm, from 0.3 nm to 1.4 nm, from 0.3 nm to 1.2 nm, or from 0.3 to 1.1 nm).

The photonic materials can, for example, have an average composite thickness wherein the average composite thickness is the sum of the first average thickness, the second average thickness, and the third average thickness. The average composite thickness can, for example, be 2 nm or more (e.g., 2.1 nm or more, 2.2 nm or more, 2.3 nm or more, 2.4 nm or more, 2.5 nm or more, 2.6 nm or more, 2.7 nm or more, 2.8 nm or more, 2.9 nm or more, 3.0 nm or more, 3.1 nm or more, 3.2 nm or more, 3.3 nm or more, 3.4 nm or more, 3.5 nm or more, 3.6 nm or more, 3.7 nm or more, 3.8 nm or more, 3.9 nm or more, 4.0 nm or more, 4.1 nm or more, 4.2 nm or more, 4.3 nm or more, 4.4 nm or more, 4.5 nm or more, 4.6 nm or more, 4.7 nm or more, 4.8 nm or more, 4.9 nm or more, 5.0 nm or more, 5.1 nm or more, 5.2 nm or more, 5.3 nm or more, 5.4 nm or more, or 5.5 nm or more). In some examples, the average composite thickness can be 6 nm or less (e.g., 5.9 nm or less, 5.8 nm or less, 5.7 nm or less, 5.6 nm or less, 5.5 nm or less, 5.4 nm or less, 5.3 nm or less, 5.2 nm or less, 5.1 nm or less, 5.0 nm or less, 4.9 nm or less, 4.8 nm or less, 4.7 nm or less, 4.6 nm or less, 4.5 nm or less, 4.4 nm or less, 4.3 nm or less, 4.2 nm or less, 4.1 nm or less, 4.0 nm or less, 3.9 nm or less, 3.8 nm or less, 3.7 nm or less, 3.6 nm or less, 3.5 nm or less 3.4 nm or less, 3.3 nm or less, 3.2 nm or less, 3.1 nm or less, 3.0 nm or less, 2.9 nm or less, 2.8 nm or less, 2.7 nm or less, 2.6 nm or less, or 2.5 nm or less). The average composite thickness can range from any of the minimum values described above to any of the maximum values described above. For example, the average composite thickness can be from 2 nm to 6 nm (e.g., from 2.5 nm to 5.5 nm, from 3 nm to 5 nm, from 3.1 nm to 4.9 nm, from 3.2 nm to 4.8 nm, from 3.3 nm to 4.7 nm, from 3.4 nm to 4.6 nm, from 3.5 nm to 4.5 nm, from 3.6 nm to 4.4 nm, from 3.7 nm to 4.3 nm, from 3.8 nm to 4.2 nm or from 3.9 nm to 4.1 nm).

In some examples, the photonic materials can be sandwiched between two barrier layers to form a quantum well.

In some examples, the photonic materials can further comprise a fourth layer, wherein the fourth layer can be disposed on the third layer, such that the third layer is sandwiched between the second layer and the fourth layer. The fourth layer can comprise $Al_zGa_{1-z}N$ where z is from 0.01 to 0.5. For example, z can be 0.01 or more (e.g., 0.02 or more, 0.03 or more, 0.04 or more, 0.05 or more, 0.06 or more, 0.07 or more, 0.08 or more, 0.09 or more, 0.10 or more, 0.11 or more, 0.12 or more, 0.13 or more, 0.14 or more, 0.15 or more, 0.16 or more, 0.17 or more, 0.18 or more, 0.19 or more, 0.20 or more, 0.21 or more, 0.22 or more, 0.23 or more, 0.24 or more, 0.25 or more, 0.26 or more, 0.27 or more, 0.28 or more, 0.29 or more, 0.30 or more, 0.31 or more, 0.32 or more, 0.33 or more, 0.34 or more, 0.35 or more, 0.4 or more, or 0.45 or more). In some examples, z can be 0.5 or less (e.g., 0.45 or less, 0.4 or less, 0.35 or less, 0.34 or less, 0.33 or less, 0.32 or less, 0.31 or less, 0.30 or less, 0.29 or less, 0.28 or less, 0.27 or less, 0.26 or less, 0.25 or less, 0.24 or less, 0.23 or less, 0.22 or less, 0.21 or less, 0.20 or less, 0.19 or less, 0.18 or less, 0.17 or less, 0.16 or less, 0.15 or less, 0.14 or less, 0.13 or less, 0.12 or less, 0.11 or less, 0.10 or less, 0.09 or less, 0.08 or less, 0.07 or less, 0.06 or less, or 0.05 or less). The value of z can range from any of the minimum values described above to any of the maximum values described above. For example, z can be from 0.01 to 0.5 (e.g., from 0.01 to 0.25, from 0.25 to 0.5, from 0.01 to 0.15, from 0.15 to 0.25, from 0.25 to 0.35, from 0.35 to 0.5, from 0.01 to 0.35, from 0.1 to 0.3, or from 0.15 to 0.25). In some examples, z is 0.2. In some examples, the fourth layer can consist of $Al_zGa_{1-z}N$.

The fourth layer can have a fourth average thickness of 0.2 nm or more (e.g., 0.3 nm or more, 0.4 nm or more, 0.5 nm or more, 0.6 nm or more, 0.7 nm or more, 0.8 nm or more, 0.9 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.1 nm or more, 2.2 nm or more, 2.3 nm or more, 2.4 nm or more, 2.5 nm or more, 2.6 nm or more, 2.7 nm or more, 2.8 nm or more, 2.9 nm or more, 3.0 nm or more, 3.1 nm or more, 3.2 nm or more, 3.3 nm or more, 3.4 nm or more, or 3.5 nm or more). In some examples, the fourth layer can have a fourth average thickness of 4 nm or less (e.g., 3.9 nm or less, 3.8 nm or less, 3.7 nm or less, 3.6 nm or less, 3.5 nm or less, 3.4 nm or less, 3.3 nm or less, 3.2 nm or less, 3.1 nm or less, 3.0 nm or less, 2.9 nm or less, 2.8 nm or less, 2.7 nm or less, 2.6 nm or less, 2.5 nm or less, 2.4 nm or less, 2.3 nm or less, 2.2 nm or less, 2.1 nm or less, 2.0 nm or less, 1.9 nm or less, 1.8 nm or less, 1.7 nm or less, 1.6 nm or less, 1.5 nm or less, 1.4 nm or less, 1.3 nm or less, 1.2 nm or less, 1.1 nm or less, 1.0 nm or less, 0.9 nm or less, 0.8 nm or less, 0.7 nm or less, 0.6 nm or less, or 0.5 nm or less). The further average thickness of the fourth layer can range from any of the minimum values described above to any of the maximum values described above. For example, the fourth layer can have a fourth average thickness of from 0.2 nm to 4 nm (e.g., from 0.2 nm to 3.5 mm, from 0.5 nm to 3 nm, from 0.5 to 2.5 nm, from 1.0 nm to 2.0 nm, from 1.1 nm to 1.9 nm, from 1.2 nm to 1.8 nm, from 1.3 nm to 1.7, or from 1.4 nm to 1.6 nm).

In some examples, the photonic materials can further comprise a fifth layer, wherein the fifth layer can be disposed on the fourth layer, such that the fourth layer is sandwiched between the fifth layer and the third layer. In some examples, the fifth layer comprises GaN.

In some examples, the photonic materials can further comprise a sixth layer, wherein the sixth layer can be disposed on the first layer, such that the first layer is sandwiched between the sixth layer and the second layer. In some examples, the sixth layer comprises GaN.

The photonic materials described wherein can have an electron wavefunction with a first confined state and a hole wavefunction with a first confined state, and wherein the overlap of the electron wavefunction and the hole wavefunction in the first confined state in the photonic material is 20% or more (e.g., 25% or more, 30% or more, 35% or more, 40% or more, 45% or more, 50% or more, 51% or more, 52% or more, 53% or more, 54% or more, 55% or more, 56% or more, 57% or more, 58% or more, 59% or more, 60% or more, 61% or more, 62% or more, 63% or more, 64% or more, 65% or more, 66% or more, 67% or more, 68% or more, 69% or more, 70% or more, 75% or more, 80% or more, 85% or more, 90% or more, or 95% or more).

In some examples, the photonic material has a spontaneous emission spectrum with a peak wavelength of 500 nm or more (e.g., 510 nm or more, 520 nm or more, 530 nm or more, 540 nm or more, 550 nm or more, 560 nm or more, 570 nm or more, 580 nm or more, 590 nm or more, 600 nm or more, 610 nm or more, 620 nm or more, 630 nm or more, 640 nm or more, 650 nm or more, 660 nm or more, 670 nm or more, 680 nm or more, 690 nm or more, 700 nm or more, 725 nm or more, 750 nm or more, 775 nm or more, 800 nm or more, 825 nm or more, 850 nm or more, 875 nm or more, 900 nm or more, 925 nm or more, 950 nm or more, 975 nm or more, 1000 nm or more, 1050 nm or more, 1100 nm or more, 1150 nm or more, 1200 nm or more, 1250 nm or more, or 1300 nm or more).

In some examples, the photonic material can have a spontaneous emission spectrum with a peak wavelength of 1400 nm or less (e.g., 1350 nm or less, 1300 nm or less, 1250 nm or less, 1200 nm or less, 1150 nm or less, 1100 nm or less, 1050 nm or less, 1000 nm or less, 970 nm or less, 950 nm or less, 925 nm or less, 900 nm or less, 875 nm or less, 850 nm or less, 825 nm or less, 800 nm or less, 775 nm or less, 750 nm or less, 725 nm or less, 700 nm or less, 690 nm or less, 680 nm or less, 670 nm or less, 660 nm or less, 650 nm or less, 640 nm or less, 630 nm or less, 620 nm or less, 610 nm or less, 600 nm or less, 590 nm or less, 580 nm or less, 570 nm or less, 560 nm or less, 550 nm or less, 540 nm or less, or 530 nm or less).

The peak wavelength of the spontaneous emission spectrum of the photonic material can range from any of the minimum values described above to any of the maximum values described above. For example, the photonic material can have a spontaneous emission spectrum with a peak wavelength of from 500 nm to 1400 nm (e.g., from 500 nm to 950 nm, from 950 nm to 1400 nm, from 500 nm to 700 nm, from 500 nm to 570 nm, from 525 nm to 535 nm, from 570 nm to 590 nm, from 590 nm to 620 nm, from 595 to 605 nm, from 620 nm to 750 nm, from 680 nm to 690 nm, from 750 nm to 1400 nm, from 750 nm to 1000 nm, from 1000 nm to 1400 nm, from 800 nm to 1000 nm, or from 500 nm to 1200 nm).

In some examples, the photonic material can have a carrier concentration of $1 \times 10^{15}$ cm$^{-3}$ or more (e.g., $5 \times 10^{15}$ cm$^{-3}$ or more, $1 \times 10^{16}$ cm$^{-3}$ or more, $5 \times 10^{16}$ cm$^{-3}$ or more, $1 \times 10^{17}$ cm$^{-3}$ or more, $5 \times 10^{17}$ cm$^{-3}$ or more, $1 \times 10^{18}$ cm$^{-3}$ or more, $2 \times 10^{18}$ cm$^{-3}$ or more, $3 \times 10^{18}$ cm$^{-3}$ or more, $4 \times 10^{18}$ cm$^{-3}$ or more, $5 \times 10^{18}$ cm$^{-3}$ or more, $6 \times 10^{18}$ cm$^{-3}$ or more, $7 \times 10^{18}$ cm$^{-3}$ or more, $8 \times 10^{18}$ cm$^{-3}$ or more, $9 \times 10^{18}$ cm$^{-3}$ or more, $1 \times 10^{19}$ cm$^{-3}$ or more $5 \times 10^{19}$ cm$^{-3}$ or more, $1 \times 10^{20}$ cm$^{-3}$ or more, $5 \times 10^{20}$ cm$^{-3}$ or more, $1 \times 10^{21}$ cm$^{-3}$ or more, $5 \times 10^{21}$ cm$^{-3}$ or more, $1 \times 10^{22}$ cm$^{-3}$ or more, or $5 \times 10^{22}$ cm$^{-3}$ or more). In some examples, the photonic material can have a carrier concentration of $1 \times 10^{23}$ cm$^{-3}$ or less (e.g., $5 \times 10^{22}$ cm$^{-3}$ or less, $1 \times 10^{22}$ cm$^{-3}$ or less, $5 \times 10^{21}$ cm$^{-3}$ or less, $1 \times 10^{21}$ cm$^{-3}$ or less, $5 \times 10^{20}$ cm$^{-3}$ or less, $1 \times 10^{20}$ cm$^{-3}$ or less, $5 \times 10^{19}$ cm$^{-3}$ or less, $1 \times 10^{19}$ cm$^{-3}$ or less, $9 \times 10^{18}$ cm$^{-3}$ or less, $8 \times 10^{18}$ cm$^{-3}$ or less, $7 \times 10^{18}$ cm$^{-3}$ or less, $6 \times 10^{18}$ cm$^{-3}$ or less, $5 \times 10^{18}$ cm$^{-3}$ or less, $4 \times 10^{18}$ cm$^{-3}$ or less, $3 \times 10^{18}$ cm$^{-3}$ or less, $2 \times 10^{18}$ cm$^{-3}$ or less, $1 \times 10^{18}$ cm$^{-3}$ or less, $5 \times 10^{17}$ cm$^{-3}$ or less, $1 \times 10^{17}$ cm$^{-3}$ or less, or $5 \times 10^{16}$ cm$^{-3}$ or less). The carrier concentration of the photonic material can range from any of the minimum values described above to any of the maximum values described above. For example the photonic material can have a carrier concentration of from $1 \times 10^{15}$ cm$^{-3}$ to $1 \times 10^{23}$ cm$^{-3}$ (e.g., from $1 \times 10^{15}$ cm$^{-3}$ to $1 \times 10^{19}$ cm$^{-3}$, from $1 \times 10^{19}$ cm$^{-3}$ to $1 \times 10^{23}$ cm$^{-3}$, from $1 \times 10^{16}$ cm$^{-3}$ to $1 \times 10^{22}$ cm$^{-3}$, from $1 \times 10^{17}$ cm$^{-3}$ to $1 \times 10^{21}$ cm$^{-3}$, from $1 \times 10^{18}$ cm$^{-3}$ to $1 \times 10^{20}$ cm$^{-3}$, from $1 \times 10^{18}$ cm$^{-3}$ to $1 \times 10^{19}$ cm$^{-3}$, or from $1 \times 10^{18}$ cm$^{-3}$ to $5 \times 10^{18}$ cm$^{-3}$).

In some examples, the photonic material has a spontaneous emission recombination rate per unit volume of $1 \times 10^{25}$ s$^{-1}$ cm$^{-3}$ or more at a carrier concentration of from $1 \times 10^{18}$ cm$^{-3}$ to $5 \times 10^{18}$ cm$^{-3}$ (e.g., $5 \times 10^{25}$ s$^{-1}$ cm$^{-3}$ or more, $1 \times 10^{26}$ s$^{-1}$ cm$^{-3}$ or more, $5 \times 10^{26}$ s$^{-1}$ cm$^{-3}$ or more, $1 \times 10^{27}$ s$^{-1}$ cm$^{-3}$ or more, $5 \times 10^{27}$ s$^{-1}$ cm$^{-3}$ or more, $1 \times 10^{28}$ s$^{-1}$ cm$^{-3}$ or more, $5 \times 10^{28}$ s$^{-1}$ cm$^{-3}$ or more, $1 \times 10^{29}$ s$^{-1}$ cm$^{-3}$ or more, or $5 \times 10^{29}$ s$^{-1}$ cm$^{-3}$ or more). In some examples, the photonic material can have a spontaneous emission recombination rate per unit volume of $1 \times 10^{30}$ s$^{-1}$ cm$^{-3}$ or less at a carrier concentration of from $1 \times 10^{18}$ cm$^{-3}$ to $5 \times 10^{18}$ cm$^{-3}$ (e.g., $5 \times 10^{29}$ s$^{-1}$ cm$^{-1}$ or less, $1 \times 10^{29}$ s$^{-1}$ cm$^{-3}$ or less, $5 \times 10^{28}$ s$^{-1}$ cm$^{-3}$ or less, $1 \times 10^{28}$ s$^{-1}$ cm$^{-3}$ or less, $5 \times 10^{27}$ s$^{-1}$ cm$^{-3}$ or less, $1 \times 10^{27}$ s$^{-1}$ cm$^{-3}$ or less, $5 \times 10^{26}$ s$^{-1}$ cm$^{-3}$ or less, $1 \times 10^{26}$ s$^{-1}$ cm$^{-3}$ or less, or $5 \times 10^{25}$ s$^{-1}$ cm$^{-3}$ or less). The spontaneous emission recombination rate per unit volume of the photonic material at a carrier concentration of from $1 \times 10^{18}$ cm$^{-3}$ to $5 \times 10^{18}$ cm$^{-3}$ can range from any of the minimum values described above to any of the maximum values described above. For example, the photonic material can have a spontaneous emission recombination rate of from $1 \times 10^{25}$ s$^{-1}$ cm$^{-3}$ to $1 \times 10^{30}$ s$^{-1}$ cm$^{-3}$ at a carrier concentration of from $1 \times 10^{18}$ cm$^{-3}$ to $5 \times 10^{18}$ cm$^{-3}$ (e.g., from $1 \times 10^{25}$ s$^{-1}$ cm$^{-3}$ to $1 \times 10^{27}$ s$^{-1}$ cm$^{-3}$, from $1 \times 10^{27}$ s$^{-1}$ cm$^{-3}$ to $1 \times 10^{30}$ s$^{-1}$ cm$^{-3}$, from $1 \times 10^{25}$ s$^{-1}$ cm$^{-3}$ to $1 \times 10^{26}$ s$^{-1}$ cm$^{-3}$, from $1 \times 10^{26}$ s$^{-1}$ cm$^{-3}$ to $1\times10^{27}$ s$^{-1}$ cm$^{-3}$, from $1\times10^{27}$ s$^{-1}$, cm$^{-3}$ to $1\times10^{28}$ s$^{-1}$ cm$^{-3}$, from $1\times10^{28}$ s$^{-1}$ cm$^{-3}$ to $1\times10^{29}$ s$^{-1}$ cm$^{-3}$, from $1\times10^{29}$ s$^{-1}$ cm$^{-3}$ to $1\times10^{30}$ s$^{-1}$ cm$^{-3}$, or from $5\times10^{25}$ s$^{-1}$ cm$^{-3}$ to $5\times10^{29}$ s$^{-1}$ cm$^{-3}$).

In some examples, the spontaneous emission spectrum of the photonic material exhibits a peak wavelength of 500 nm or more and the peak wavelength has an intensity of $1\times10^{26}$ s$^{-1}$ cm$^{-3}$ eV$^{-1}$ or more at a carrier concentration of from $1\times10^{18}$ cm$^{-3}$ to $5\times10^{18}$ cm$^{-3}$ (e.g., $5\times10^{26}$ s$^{-1}$ cm$^{-3}$ eV$^{-1}$ or more, $1\times10^{27}$ s$^{-1}$ cm$^{-3}$ eV$^{-1}$ or more, $5\times10^{27}$ s$^{-1}$ cm$^{-3}$ eV$^{-1}$ or more $1\times10^{28}$ s$^{-1}$ cm$^{-3}$ eV$^{-1}$ or more) $5\times10^{28}$ s$^{-1}$ cm$^{-3}$ eV$^{-1}$ or more, $1\times10^{29}$ s$^{-1}$ cm$^{-3}$ or more, or $5\times10^{29}$ s$^{-1}$ cm$^{-3}$ eV$^{-1}$ or more). In some examples, the spontaneous emission spectrum of the photonic material exhibits a peak wavelength of 500 nm or more and the peak wavelength has an intensity of $1\times10^{30}$ s$^{-1}$ cm$^{-3}$ eV$^{-1}$ or less at a carrier concentration of from $1\times10^{18}$ cm$^{-3}$ to $5\times10^{18}$ cm$^{-3}$ (e.g., $5\times10^{29}$ s$^{-1}$ cm$^{-3}$ eV$^{-1}$ or less, $1\times10^{29}$ s$^{-1}$ cm$^{-3}$ eV$^{-1}$ or less, $5\times10^{28}$ s$^{-1}$ cm$^{-3}$ eV$^{-1}$ or less, $1\times10^{28}$ s$^{-1}$ cm$^{-3}$ eV$^{-1}$ or less, $5\times10^{27}$ s$^{-1}$ cm$^{-3}$ eV$^{-1}$ or less, $1\times10^{27}$ s$^{-1}$ cm$^{-3}$ eV$^{-1}$ or less, or $5\times10^{26}$ s$^{-1}$ cm$^{-3}$ eV$^{-1}$ or less). The intensity of the peak wavelength of the spontaneous emission spectrum of the photonic material at a carrier concentration of from $1\times10^{18}$ cm$^{-3}$ to $5\times10^{18}$ cm$^{-3}$ can range from any of the minimum values described above to any of the maximum values described above. For example, the spontaneous emission spectrum of the photonic material exhibits a peak wavelength of 500 nm or more and the peak wavelength has an intensity of from $1\times10^{26}$ s$^{-1}$ cm$^{-3}$ eV$^{-1}$ to $1\times10^{30}$ s$^{-1}$ cm$^{-3}$ eV$^{-1}$ at a carrier concentration of from $1\times10^{18}$ cm$^{-3}$ to $5\times10^{18}$ cm$^{-3}$ (e.g., from $1\times10^{26}$ s$^{-1}$ cm$^{-3}$ eV$^{-1}$ to $1\times10^{28}$ s$^{-1}$ cm$^{-3}$ eV$^{-1}$, from $1\times10^{28}$ s$^{-1}$ cm$^{-3}$ eV$^{-1}$ to $1\times10^{30}$ s$^{-1}$ cm$^{-3}$ eV$^{-1}$, from $1\times10^{26}$ s$^{-1}$ cm$^{-3}$ eV$^{-1}$ to $1\times10^{27}$ s$^{-1}$ cm$^{-3}$ eV$^{-1}$, from $1\times10^{27}$ s$^{-1}$ cm$^{-3}$ eV$^{-1}$ to $1\times10^{28}$ s$^{-1}$ cm$^{-3}$ eV$^{-1}$, from $1\times10^{28}$ s$^{-1}$ cm$^{-3}$ eV$^{-1}$ to $1\times10^{29}$ s$^{-1}$ cm$^{-3}$ eV$^{-1}$, from $1\times10^{29}$ s$^{-1}$ cm$^{-3}$ eV$^{-1}$ to $1\times10^{30}$ s$^{-1}$ cm$^{-3}$ eV$^{-1}$, or from $5\times10^{26}$ s$^{-1}$ cm$^{-3}$ eV$^{-1}$ to $5\times10^{29}$ s$^{-1}$ cm$^{-3}$ eV$^{-1}$).

In certain examples, x and/or y is 0.22. In some examples, the first layer has a first average thickness of from 1.9 nm to 2.1 nm, the second layer has a second average thickness of from 0.9 nm to 1 nm, and the third layer has a third average thickness of from 0.9 nm to 1.1 nm. The photonic material can, for example, have an electron wavefunction with a first confined state and a hole wavefunction with a first confined state, and wherein the overlap of the electron wavefunction and the hole wavefunction in the first confined state in the photonic material is 55% or more. In some examples, the photonic material has a spontaneous emission spectrum with a peak wavelength of from 680 nm to 690 nm. In some examples, the spontaneous emission spectrum of the photonic material exhibits a peak wavelength of from 680 nm to 690 nm and the peak wavelength has an intensity of $1\times10^{27}$ s$^{-1}$ cm$^{-3}$ eV$^{-1}$ or more at a carrier concentration of $1\times10^{18}$ cm$^{-3}$ or more.

In certain examples, x and/or y is 0.12. In some examples, the first layer has a first average thickness of from 1.9 nm to 2.1 nm, the second layer has a second average thickness of from 0.6 nm to 0.8 nm, and the third layer has a third average thickness of from 0.7 nm to 0.9 nm. The photonic material can, for example, have an electron wavefunction with a first confined state and a hole wavefunction with a first confined state, and wherein the overlap of the electron wavefunction and the hole wavefunction in the first confined state in the photonic material is 60% or more. In some examples, the photonic material has a spontaneous emission spectrum with a peak wavelength of from 595 nm to 605 nm. In some examples, the spontaneous emission spectrum of the photonic material exhibits a peak wavelength of from 595 nm to 605 nm and the peak wavelength has an intensity of $1\times10^{27}$ s$^{-1}$ cm$^{-3}$ eV$^{-1}$ or more at a carrier concentration of $1\times10^{18}$ cm$^{-3}$ or more.

In certain examples, x and/or y is 0.11. In some examples, the first layer has a first average thickness of from 1.9 nm to 2.1 nm, the second layer has a second average thickness of from 0.3 nm to 0.5 nm, and the third layer has a third average thickness of from 0.4 nm to 0.7 nm. The photonic material can, for example, have an electron wavefunction with a first confined state and a hole wavefunction with a first confined state, and wherein the overlap of the electron wavefunction and the hole wavefunction in the first confined state in the photonic material is 60% or more. In some examples, the photonic material has a spontaneous emission spectrum with a peak wavelength of from 525 nm to 535 nm. In some examples, the spontaneous emission spectrum of the photonic material exhibits a peak wavelength of from 525 nm to 535 nm and the peak wavelength has an intensity of $1\times10^{27}$ s$^{-1}$ cm$^{-3}$ eV$^{-1}$ or more at a carrier concentration of $1\times10^{18}$ cm$^{-3}$ or more.

Also described herein are light emitting diodes (LEDs) comprising a quantum well structure, wherein the quantum well structure can comprise the any of the photonic materials described herein. Also described herein are semiconductor lasers, photovoltaics (solar cell devices), photodetectors, and the like comprising any of the photonic materials described herein.

Also disclosed herein are methods of making the photonic materials described herein. For example, the methods can comprise depositing each layer in the appropriate order, wherein each layer can be deposited by epitaxial growth methods such as metalorganic chemical vapor deposition (MOCVD), molecular beam epitaxy (MBE), or pulsed laser deposition (PLD) or combinations thereof.

A number of embodiments of the invention have been described. Nevertheless, it will be understood that various modifications may be made without departing from the spirit and scope of the invention. Accordingly, other embodiments are within the scope of the following claims.

The examples below are intended to further illustrate certain aspects of the systems and methods described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of measurement conditions, e.g., component concentrations, temperatures, pressures and other measurement ranges and conditions that can be used to optimize the described process.

Example 1

Although extensive research has resulted in 69% external quantum efficiency (EQE of InGaN based blue light emitting diodes (LEDs), efficiency of the longer visible wavelength InGaN based light emitters has remained an issue. Spontaneous polarization originating from the absence of inversion symmetry in the wurtzite structure (Keller S et al. *Semicond. Sci. Technol.*, 2014, 29, 113001) and piezoelectric polarization caused by the lattice mismatch induced strain in InGaN quantum wells (QWs) based LEDs render an internal electric field resulting in charge separation in the quantum well. The problem magnifies with an increase in In content in the InGaN quantum well or with an increase in quantum well width, and thereby further suppresses the efficiency of InGaN based LEDs emitting in green or longer wavelengths. In addition, InGaN quantum wells emitting at longer wavelength typically require the incorporation of higher In-content with lower growth temperature during growth, which suffers from low quality material with high defects.

The attempts made to date to address the low efficiency of InGaN based green-yellow-red LEDs include the use of non-polar or semi-polar InGaN (Kim K C et al *Phys. Stat. Sol. (RPL)*, 2007, 1, 125-127), staggered InGaN quantum well (Zhao H et al. *Opt. Express*, 2011, 19, A991), strain-compensated InGaN/AlGaN quantum well (Zhao H et al, *IEEE J. Quantum Electron.*, 2009, 45, 66), type-II InGaN/GaNAs quantum well (Arif R A et al. *Appl. Phys. Lett.*, 2008, 92, 011104) and InGaN-delta-InN quantum well (Zhao H et al, *Appl. Phys. Lett.*, 2010, 97, 131114). However, the issue of low efficiency of InGaN based green-yellow-red LEDs remains unsolved.

$ZnSnN_2$ belongs to $II-IV-N_2$, which is an expanded nitride material system that has not been well studied nor understood. Herein, $InGaN/ZnSnN_2$ heterostructures are designed for high efficiency light emitters application. The advantages from this design include: 1) a large valence band offset between InGaN and $ZnSnN_2$; which allows a strong hole confinement; 2) a small conduction band offset between InGaN and $ZnSnN_2$, which allows the electron wavefunction spread in the conduction band; 3) the combination of the large valence band offset and the small conduction band offset results in an enhanced electron-hole wavefunction overlap ($\Gamma_{e\_h}$); 4) a close lattice-match exists between $ZnSnN_2$, and InGaN with In-content close to 25-35%; 5) a lower In-content InGaN is needed in the IGN/ZTN/AGN quantum well designs described herein as compared to that of the conventional InGaN quantum wells targeting the same emission wavelength, thereby avoiding some of the drawbacks associated with higher In content described above.

Figure 1:
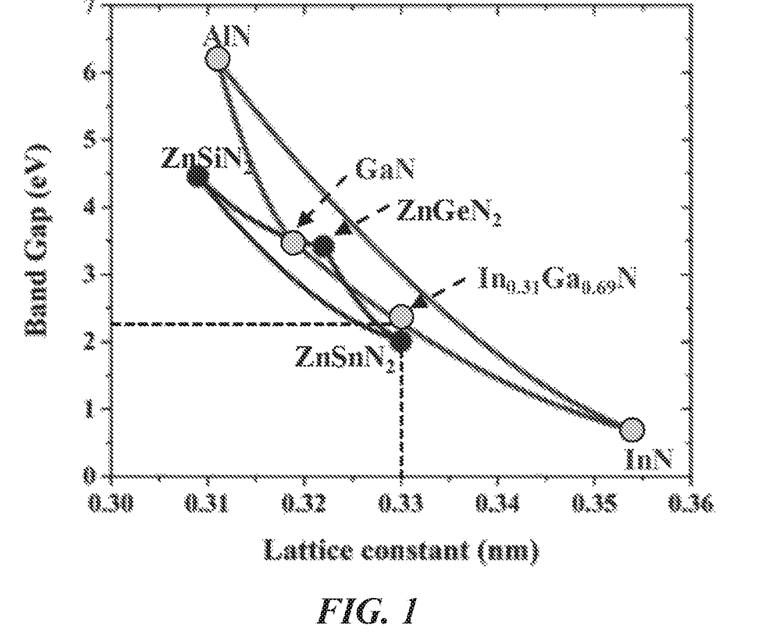
FIG. 1 shows the band gap versus lattice constant for the group-III-nitride (III-N) and Zn-IV-$N_2$ (Zn-IV-$N_2$) materials.
Figure 2:
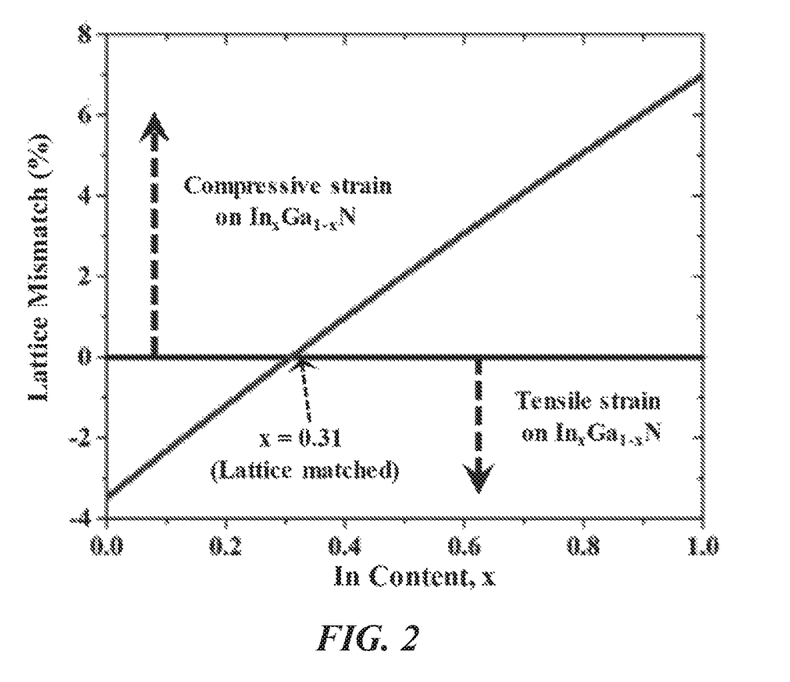
FIG. 2 shows the lattice mismatch of $In_xGa_{1-x}N$ with GaN and $ZnSnN_2$ as a function of In content, x.
Figure 3:
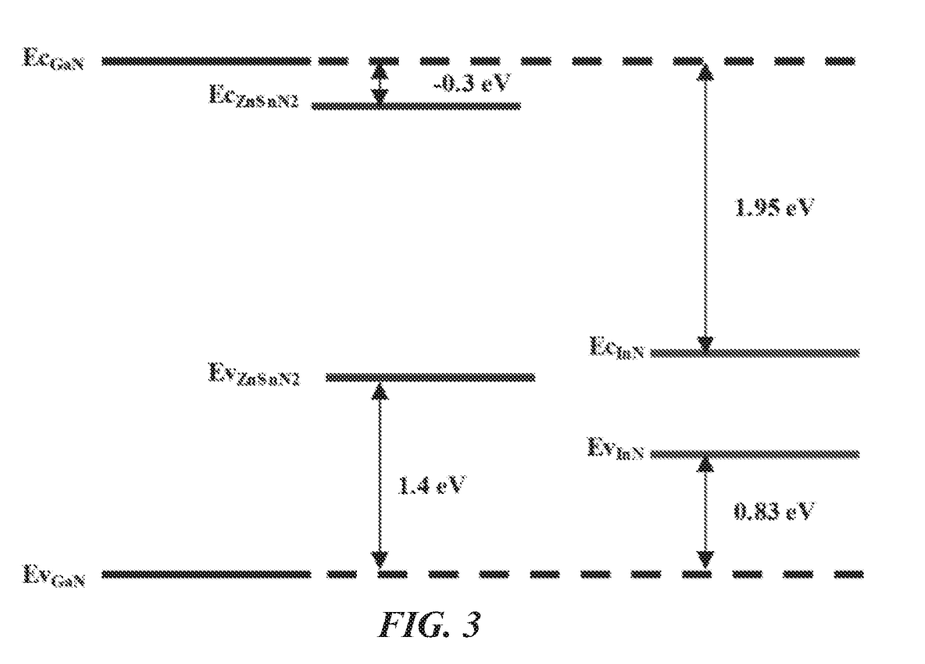
FIG. 3 shows the conduction and valence band alignment of $In_xGa_{1-x}N$ with GaN and $ZnSnN_2$.

FIG. 1 shows the band gap versus lattice constant for the group-III-nitride (III-N) and $Zn-IV-N_2(Zn-IV-N_2)$ materials. As can be seen, the lattice constant for $In_{0.31}Ga_{0.69}N$ matches with that of $ZnSnN_2$. Here, as an example, an $InGaN/ZnSnN_2$ quantum well structure was designed for high efficiency red LEDs. Note that for $In_xGa_{1-x}N$ with x<0.31, a $ZnSnN_2$ layer has a compressive strain when grown on top of the $In_xGa_{1-x}N$ layer, which is under tensile strain when grown on GaN (FIG. 2). Thus, the $InGaN/ZnSnN_2$ quantum well design can serve as a strain-compensation design, when the In-content in the InGaN layer is lower than 31%. The conduction and valence band alignment of $In_xGa_{1-x}N$ with GaN and $ZnSnN_2$ is shown in FIG. 3.

Figure 4:
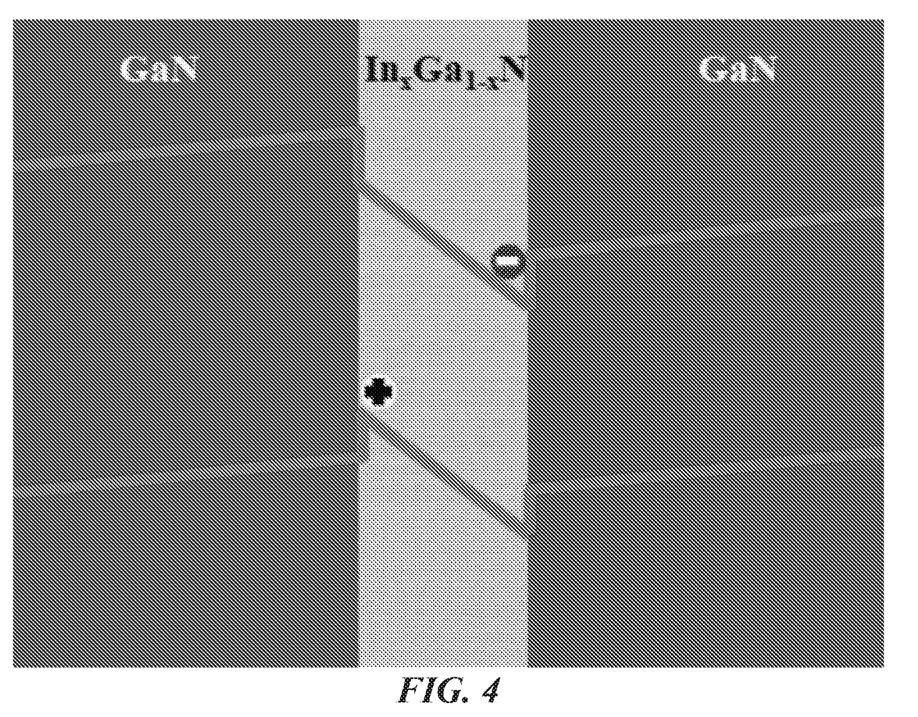
FIG. 4 shows a schematic of a conventional type-I $In_x$-$Ga_{1-x}N$ quantum well (hereafter referred as IGN quantum well).
Figure 5:
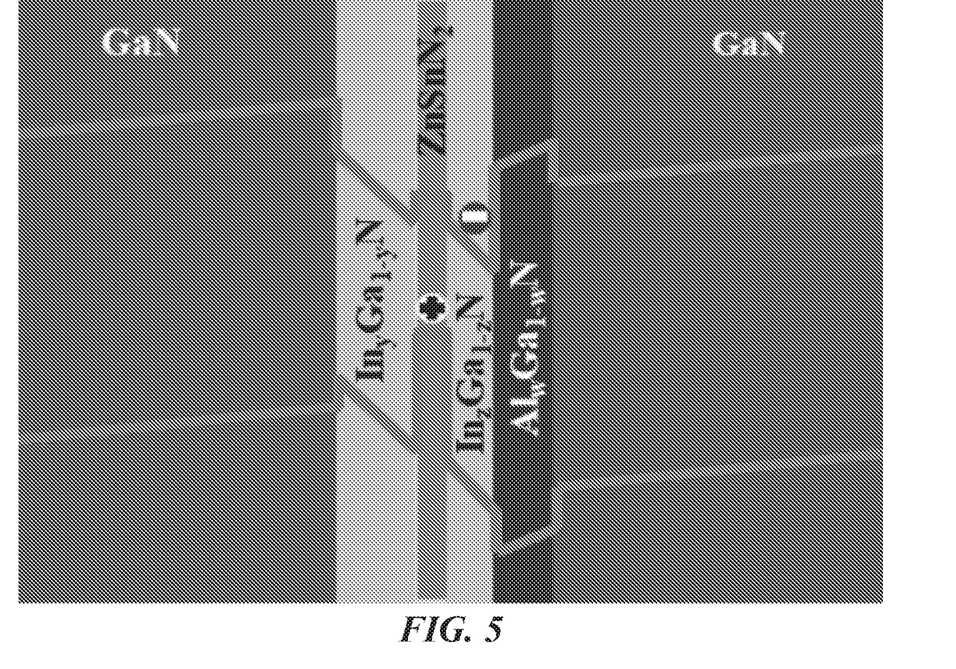
FIG. 5 shows a schematic of an $In_yGa_{1-y}N/ZnSnN_2/In_zGa_{1-z}N/Al_wGa_{1-w}N$ quantum well (hereafter referred as IGN/ZTN/AGN quantum well) structure.

FIG. 4 and FIG. 5 show the schematics of a conventional type-I $In_xGa_{1-x}N$ quantum well (hereafter referred as IGN quantum well) and the $In_yGa_{1-y}N/ZnSnN_2/In_zGa_{1-z}N/Al_wGa_{1-w}N$ quantum well (hereafter referred as IGN/ZTN/AGN quantum well) structures described herein, respectively. In the IGN/ZTN/AGN quantum well structures described herein, the $ZnSnN_2$ facilitates hole confinement while a thin AlGaN barrier layer is used for electron confinement in the quantum well. Self-consistent 6 band k.p method has been used to calculate the spontaneous emission spectra of the quantum wells. For the conventional IGN quantum well design, a quantum well thickness of 4 nm with In composition of 31% and GaN as barriers was used, which gives a peak emission wavelength of 685 nm. For the IGN/ZTN/AGN quantum well, a 2 nm-$In_{0.22}Ga_{0.78}N$/1 nm-$ZnSnN_2$/1 nm-$In_{0.22}Ga_{0.78}N$ quantum well with 1.5 nm-$Al_{0.2}Ga_{0.8}N$/GaN as barrier on one-side was used. The total thickness of the quantum well designs stay the same for both structures.

Figure 6:
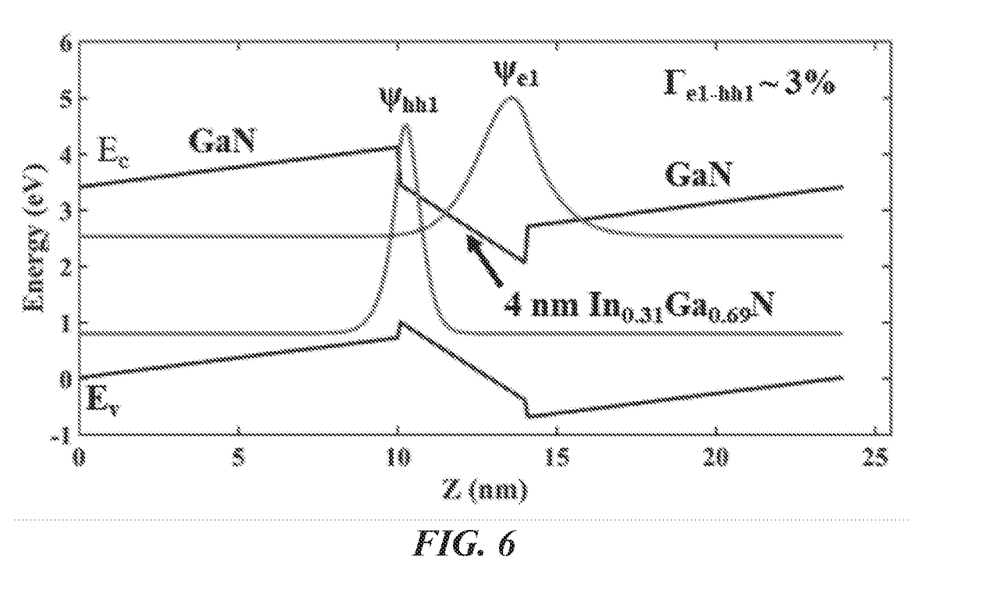
FIG. 6 shows the energy band diagram and electron and hole wavefunctions of the first confined energy states in the IGN quantum well.
Figure 7:
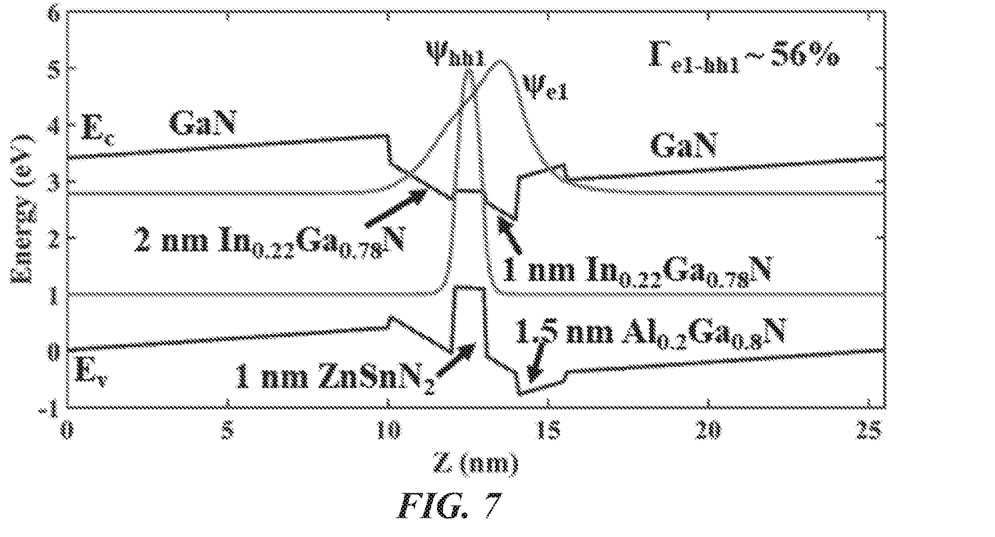
FIG. 7 shows the energy band diagram and electron and hole wavefunctions of the first confined energy states in the IGN/ZTN/AGN quantum well.

The energy band diagram and electron and hole wavefunctions of the first confined energy states in the IGN and IGN/ZTN/AGN quantum wells are shown in FIGS. 6 and 7, respectively. In the IGN/ZTN/AGN quantum well design described herein, $ZnSnN_2$ layer in the IGN/ZTN/AGN quantum well has a strong confinement of hole wavefunction, which in turn improves the $\Gamma_{e1\text{-}hh1}$ to 56% from 3% in the conventional IGN quantum well.

Figure 8:
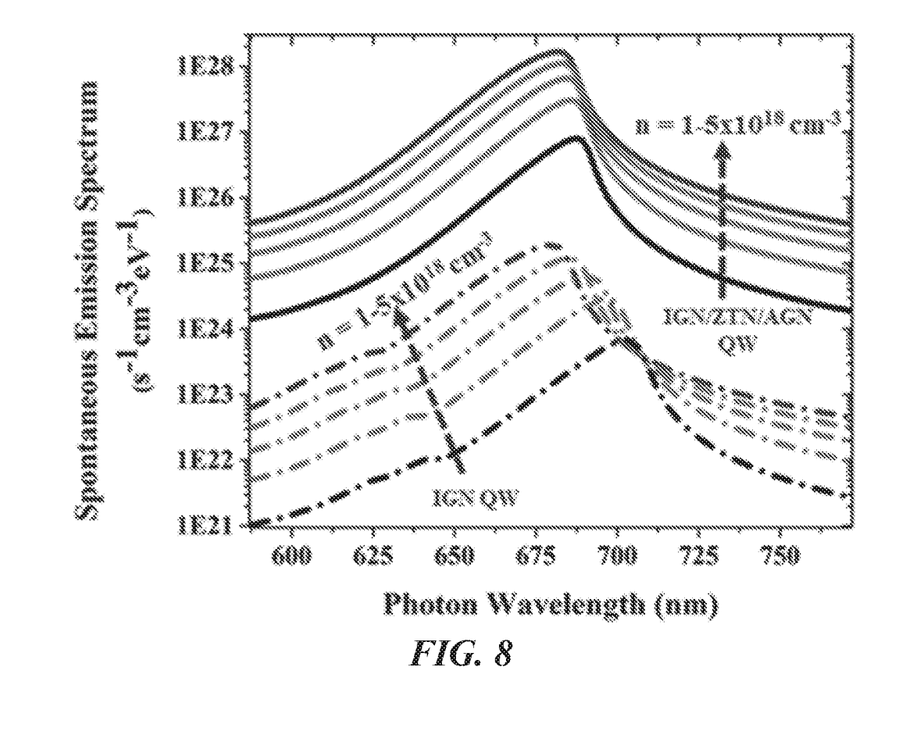
FIG. 8 plots the spontaneous emission spectra of IGN quantum well and IGN/ZTN/AGN quantum well for carrier concentrations of from $1 \times 10^{18}$ $cm^{-3}$ to $5 \times 10^{18}$ $cm^{-3}$.

FIG. 8 plots the spontaneous emission spectra of IGN quantum well and IGN/ZTN/AGN quantum well for carrier concentrations of from $1\times10^{18}$ $cm^{-3}$ to $5\times10^{18}$ $cm^{-3}$. Evidently, the IGN/ZTN/AGN quantum well provides an enhancement of approximately three orders of magnitude in the peak spontaneous emission intensity as compared to the IGN quantum well at all the carrier concentrations. This enhancement of the spontaneous emission intensities can be due to the increase in $\Gamma_{e1\text{-}hh1}$, based on the Fermi's Golden rule. In addition, the red-shift in peak spontaneous emission wavelength with the increase in carrier concentrations can be due to the carrier screening effect being suppressed in the IGN/ZTN/AGN quantum well as compared to the conventional one because of the reduction in the effective band bending.

Figure 9:
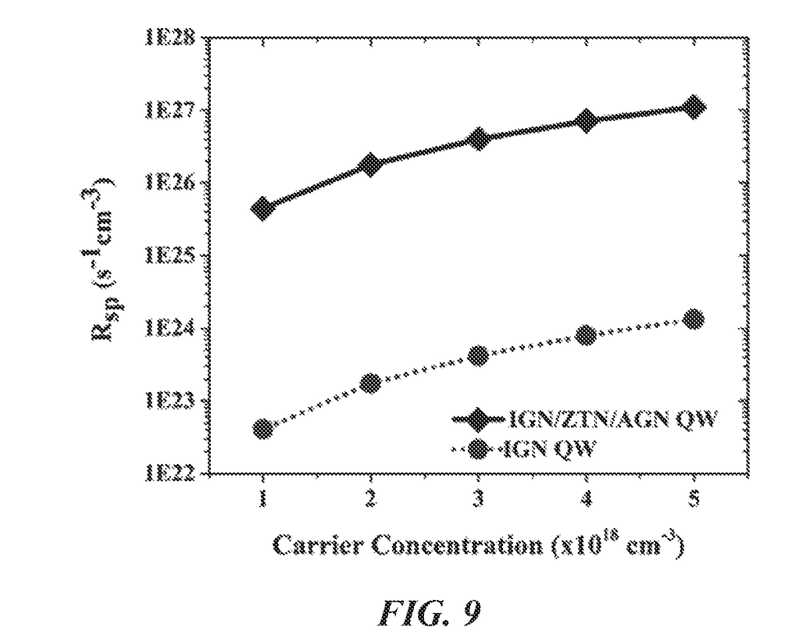
FIG. 9 plots the spontaneous emission recombination rate per unit volume, $R_{sp}$, of IGN quantum well and IGN/ZTN/AGN quantum well for carrier concentrations of from $1 \times 10^{18}$ $cm^{-3}$ to $5 \times 10^{18}$ $cm^{-3}$.

In order to evaluate the total radiative recombination rate of the two quantum well structures, the spontaneous emission recombination rate per unit volume, $R_{sp}$, was calculated by integrating the spontaneous emission spectra over the photon energy shown in FIG. 8. As can be seen from FIG. 9, $R_{sp}$ increases monotonically with the increase in carrier concentration for both quantum well structures. The IGN/ZTN/AGN quantum well demonstrates approximately three orders of magnitude higher of the spontaneous emission recombination rate as compared to that of the conventional IGN quantum well.

In summary, the proposed IGN/ZTN/AGN quantum well manifests several orders of magnitude improvement in spontaneous emission intensity and spontaneous emission recombination rate at red (685 nm) wavelengths with much lower In composition than that required for conventional InGaN quantum wells. This quantum well design has great promise to tackle the current challenges of low quantum efficiency of InGaN quantum well based light emitters emitting beyond blue wavelength regime. Thus, white LEDs based on the integration of RGB LEDs on the same III-nitride material platform can be realized.

Example 2

To date, amber (590 nm-620 nm) LEDs have the poorest internal quantum efficiency (IQE). A high efficiency amber LED is needed. Described herein are InGaN-based amber LEDs with improved efficiency.

Figure 10:
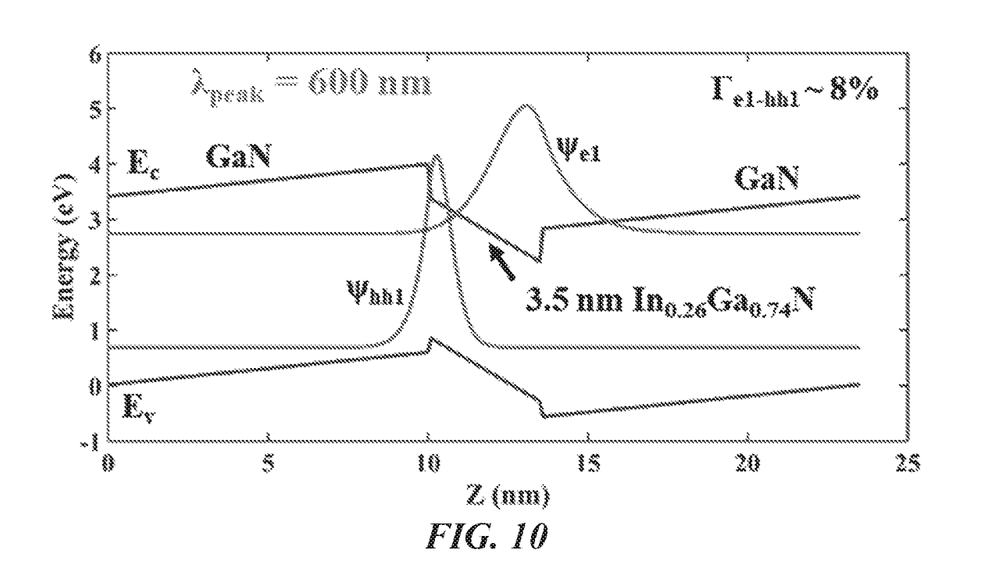
FIG. 10 plots the band alignment and electron and hole wavefunctions in the first confined state in an IGN quantum well with peak emission wavelength at 600 nm.
Figure 11:
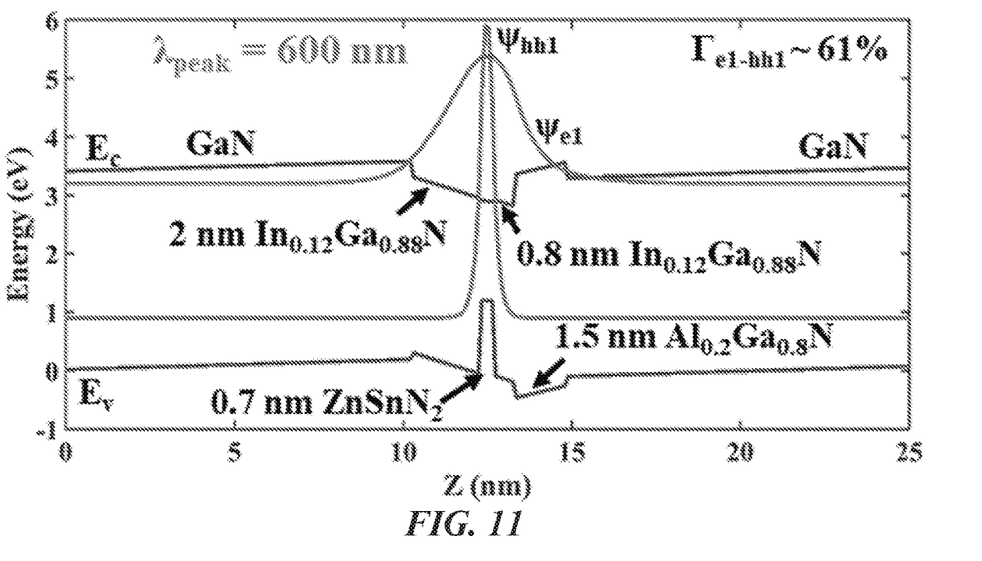
FIG. 11 plots the band alignment and electron and hole wavefunctions in the first confined state in an IGN/ZTN/IGN/AGN quantum well with peak emission wavelength at 600 nm.

Simulations show that the proposed $InGaN/ZnSnN_2/Al$-GaN quantum well structure can potentially improve the internal quantum efficiency of amber LEDs to the level of internal quantum efficiency of well-developed InGaN based blue LEDs. FIG. 10 and FIG. 11 shows the band alignment in a GaN/3.5 nm $In_{0.26}Ga_{0.74}N$/GaN quantum well and in a GaN/2 nm $In_{0.12}Ga_{0.88}N$/0.7 nm $ZnSnN_2$/0.8 nm $In_{0.12}Ga_{0.88}N$/1.5 nm $Al_{0.2}Ga_{0.8}N$/GaN quantum well, respectively. The corresponding electron- and hole-wavefunctions in the first confined states in conduction and valence band are also shown for both structures. The calculated $\Gamma_{e1\text{-}hh1}$ increases from 8% for the conventional IGN quantum well structure to 61% for the case of the IGN/ZTN/AGN quantum well structure. Both of these quantum well structures have peak spontaneous emission intensity at around 600 nm.

Figure 12:
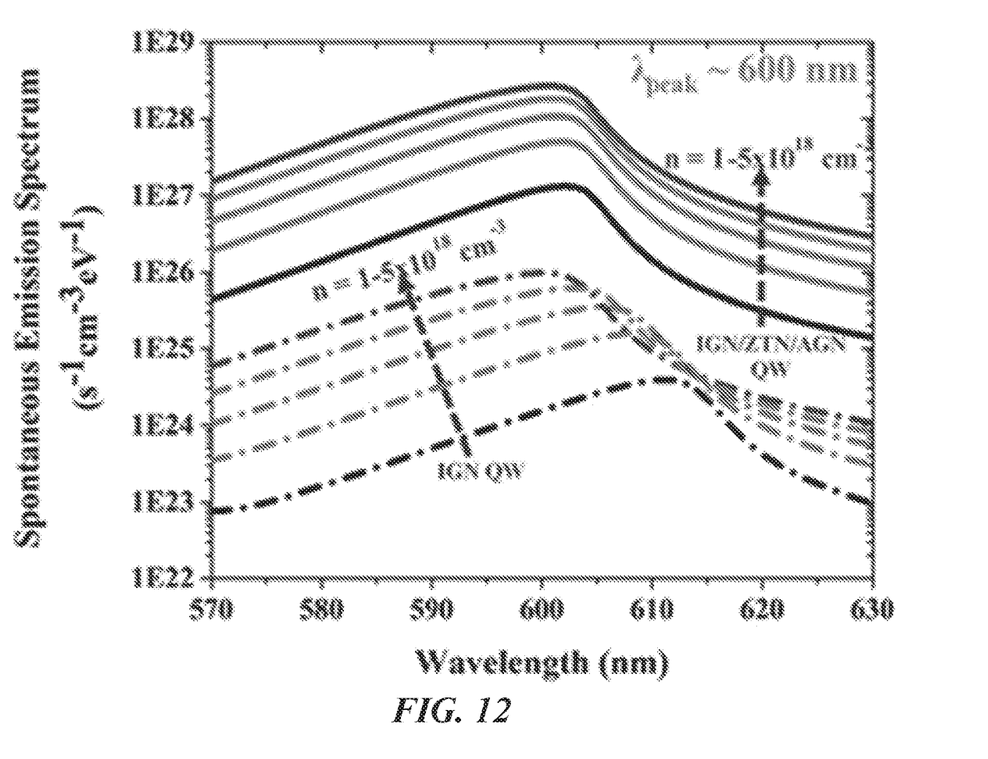
FIG. 12 plots the spontaneous emission spectra of the IGN and IGN/ZTN/IGN/AGN quantum wells with peak spontaneous emission at 600 nm wavelength for carrier concentration of from $1 \times 10^{18}$ $cm^{-3}$ to $5 \times 10^{18}$ $cm^{-3}$.
Figure 13:
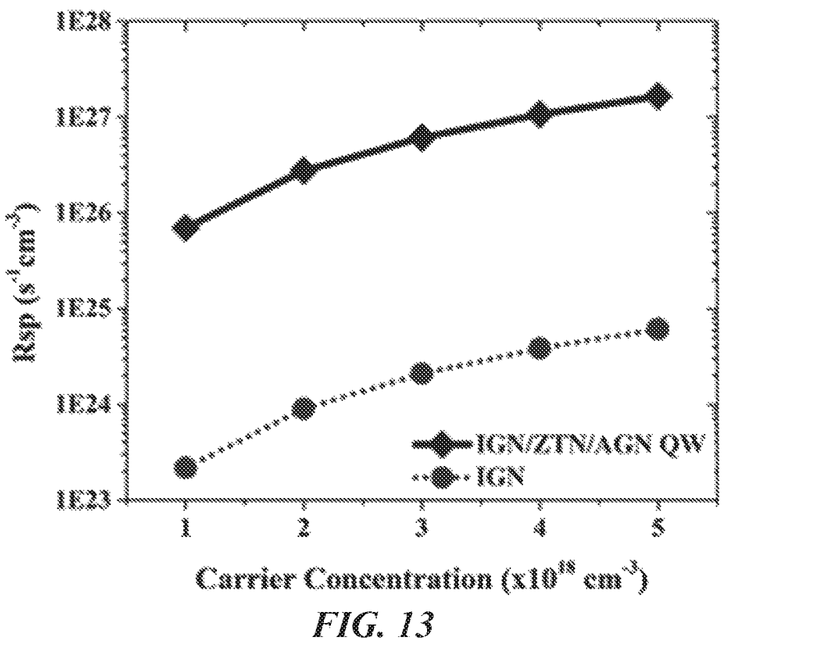
FIG. 13 plots the spontaneous emission radiative recombination rate of the IGN and IGN/ZTN/IGN/AGN quantum wells with peak spontaneous emission at 600 nm wavelength for carrier concentration of from $1 \times 10^{18}$ $cm^{-3}$ to $5 \times 10^{18}$ $cm^{-3}$.

Spontaneous emission spectra of the IGN/ZTN/AGN quantum well with a $\lambda_{peak}$~600 nm are compared with those of an IGN quantum well for carrier concentrations of from $1\times10^{18}$ cm$^{-3}$ to $5\times10^{18}$ cm$^{-3}$ in FIG. 12. An enhancement in the peak intensity for spontaneous emission of three orders of magnitude was observed for the proposed IGN/ZTN/AGN quantum structure as compared to that of the conventional quantum well. Consequently, spontaneous emission recombination rate, $R_{sp}$, of IGN/ZTN/AGN quantum well also increases by the same order of magnitude with respect to that of IGN quantum well (FIG. 13).

The proposed IGN/ZTN/AGN quantum well manifests several orders of magnitude improvement in spontaneous emission intensity and spontaneous emission recombination rate in both red (685 nm) and amber (600 nm) wavelengths region, with much lower In composition than that is required for the conventional InGaN quantum wells emitting at the same wavelength.

This IGN/ZTN/AGN quantum well design has great promises to tackle the current challenges of low quantum efficiency of InGaN quantum well based LEDs beyond blue. Thus, white LEDs based on the integration of RGB LEDs on the same III-nitride material platform can be realized.

Example 3

Figure 14:
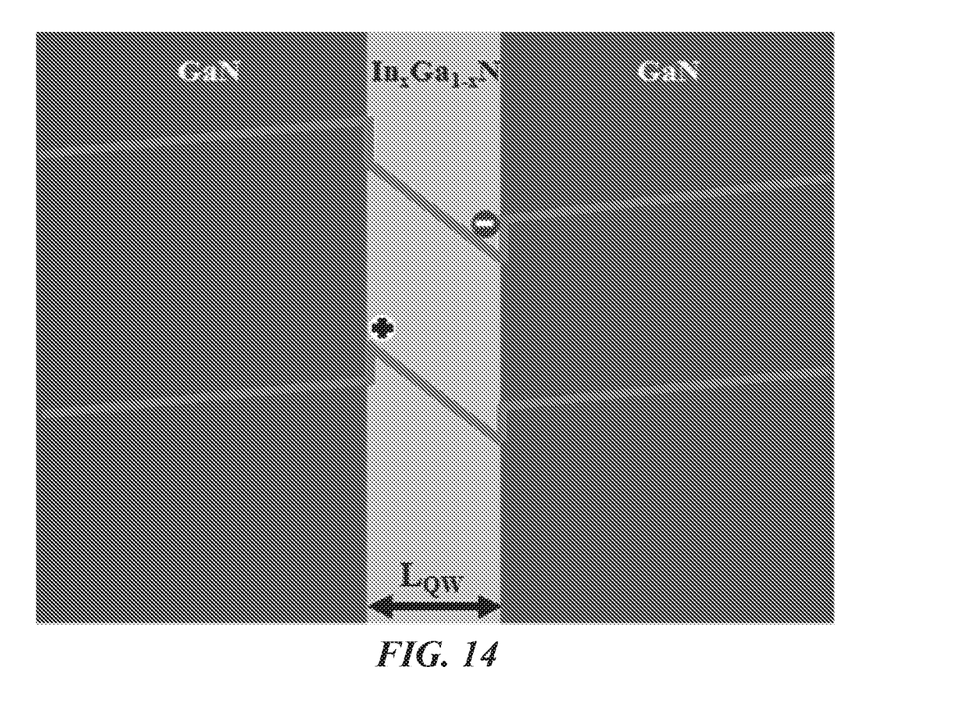
FIG. 14 shows a schematic diagram of an $In_xGa_{1-x}N$ quantum well with the width of the quantum well ($L_{QW}$) indicated.

The peak emission wavelength of an $In_xGa_{1-x}N$ quantum well depends on the overall width of the quantum well, $L_{QW}$, and the In content, x (FIG. 14). A larger $L_{QW}$ and/or a larger x results in a longer peak emission wavelength. Further, as described above, a larger $L_{QW}$ and/or a larger x in a traditional $In_xGa_{1-x}N$ quantum well results in a reduced quantum efficiency.

Figure 15:
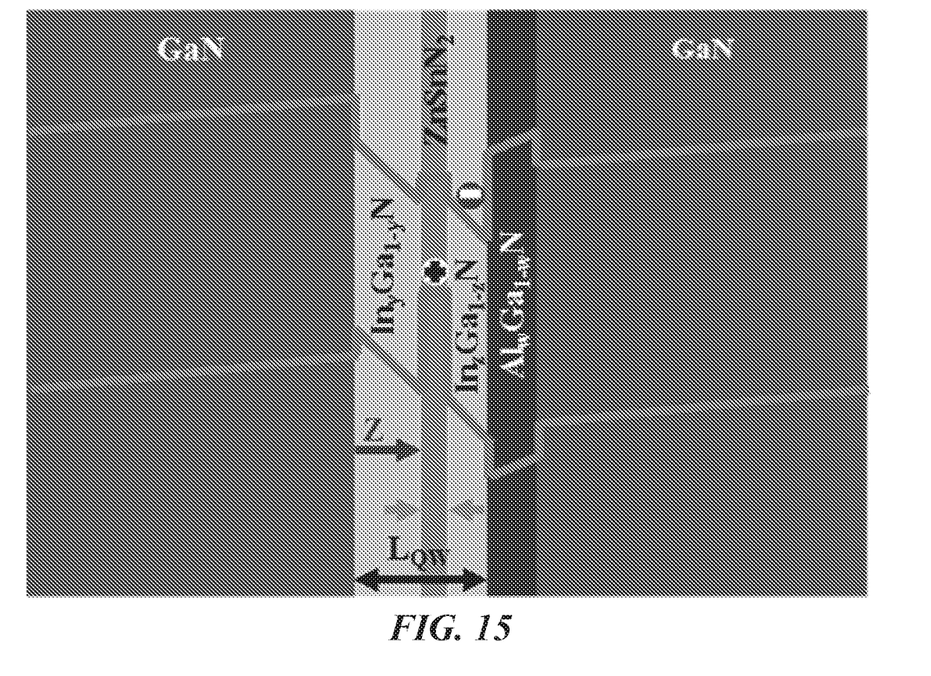
FIG. 15 shows a schematic diagram of the proposed IGN/ZTN/AGN quantum wells with the width of the quantum well ($L_{QW}$), the position of the ZTN layer (Z), and the thickness of the ZTN layer (L) indicated.

In addition to the $L_{QW}$ and x, the peak emission wavelength for the proposed IGN/ZTN/AGN quantum wells further depends on the position of the ZTN layer, Z, and the thickness of the ZTN layer, L (FIG. 15), because the ZTN layer provides both strong hole confinement and strain compensation. Accordingly, by adjusting $L_{QW}$, x, Z, and/or L the peak emission wavelength for the proposed IGN/ZTN/AGN quantum wells can be tuned.

To investigate the effect of $L_{QW}$, x, Z, and/or L on the peak emission wavelength for the proposed IGN/ZTN/AGN quantum wells, several simulations were run as described above with the following parameters: $L_{QW}$ is 4 nm, x is 0.22, L is from 0.4 nm to 1.0 nm, and Z is from 0.5 nm to 2.5 nm.

Figure 16:
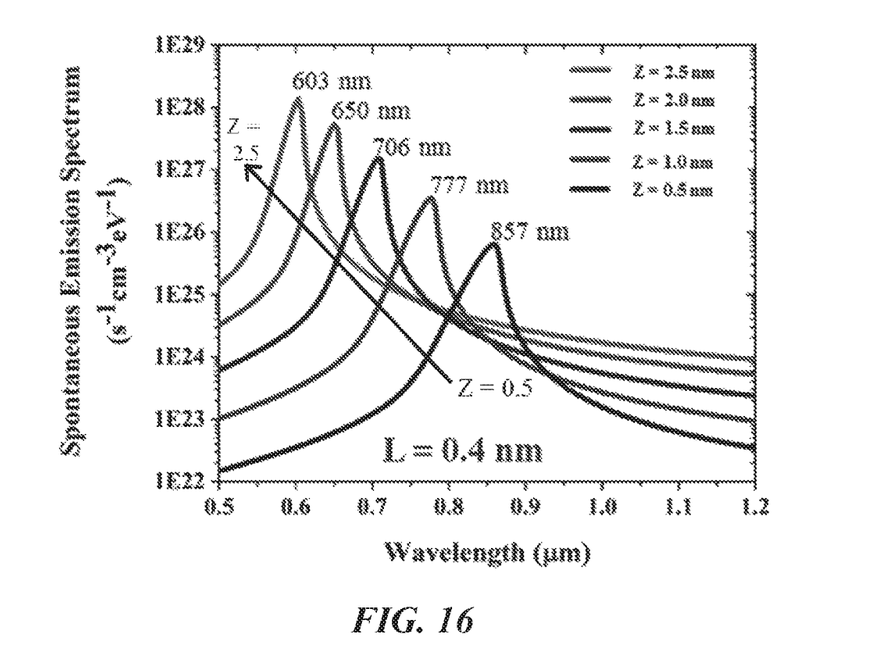
FIG. 16 shows the spontaneous emission spectra for a GaN/Z $In_{0.22}Ga_{0.78}N/L$ $ZnSnN_2/(L_{QW}$-Z-L) $In_{0.22}Ga_{0.78}N/$ 1.5 nm $Al_{0.2}Ga_{0.8}N/GaN$ quantum well with an L value of 0.4 nm and where Z is from 0.5 nm to 2.5 nm.

The results for a GaN/Z $In_{0.22}Ga_{0.78}N$/L $ZnSnN_2$/($L_{QW}$-Z-L) $In_{0.22}Ga_{0.78}N$/1.5 nm $Al_{0.2}Ga_{0.8}N$/GaN quantum well with an L value of 0.4 nm and where Z is from 0.5 nm to 2.5 nm are shown in FIG. 16, As can be seen in FIG. 16, as Z increases from 0.5 nm to 2.5 nm, the peak emission wavelength blue shifts from 857 nm to 603 nm.

Figure 17:
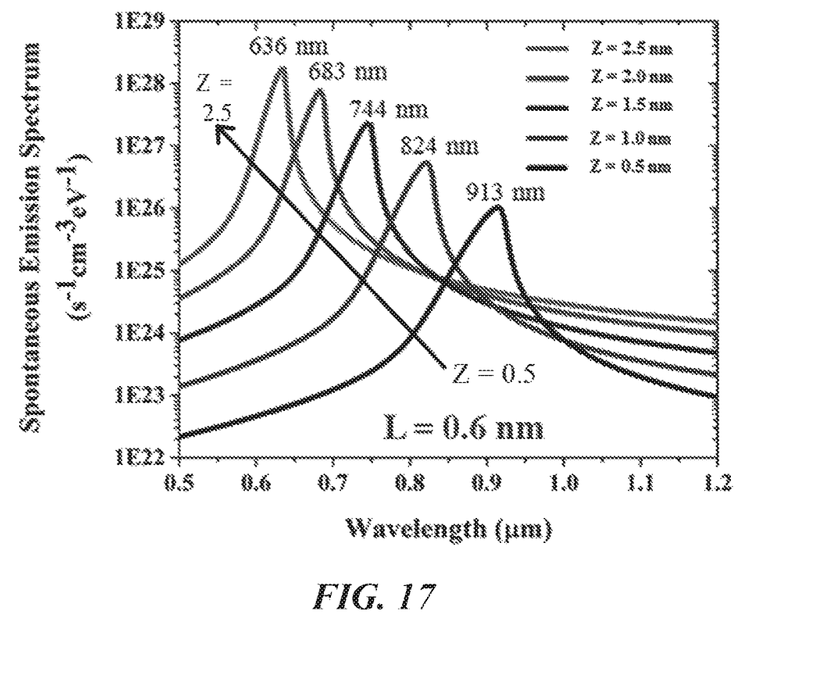
FIG. 17 shows the spontaneous emission spectra for a GaN/Z $In_{0.22}Ga_{0.78}N/L$ $ZnSnN_2/(L_{QW}$-Z-L) $In_{0.22}Ga_{0.78}N/$ 1.5 nm $Al_{0.2}Ga_{0.8}N/GaN$ quantum well with an L value of 0.6 nm and where Z is from 0.5 nm to 2.5 nm.

The results for a GaN/Z $In_{0.22}Ga_{0.78}N$/L $ZnSnN_2$/($L_{QW}$-Z-L) $In_{0.22}Ga_{0.78}N$/1.5 nm $Al_{0.2}Ga_{0.8}N$/GaN quantum well with an L value of 0.6 nm and where Z is from 0.5 nm to 2.5 nm are shown in FIG. 17, As can be seen in FIG. 17, as Z increases from 0.5 nm to 2.5 nm, the peak emission wavelength blue shifts from 913 nm to 636 nm.

Figure 18:
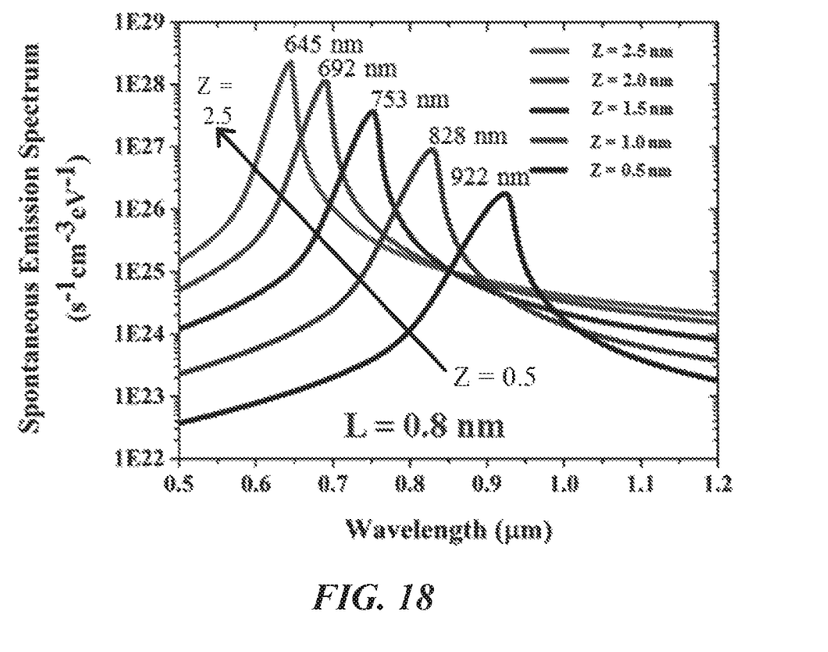
FIG. 18 shows the spontaneous emission spectra for a GaN/Z $In_{0.22}Ga_{0.78}N/L$ $ZnSnN_2/(L_{QW}$-Z-L) $In_{0.22}Ga_{0.78}N/$ 1.5 nm $Al_{0.2}Ga_{0.8}N/GaN$ quantum well with an L value of 0.8 nm and where Z is from 0.5 nm to 2.5 nm.

The results for a GaN/Z $In_{0.22}Ga_{0.78}N$/L $ZnSnN_2$/($L_{QW}$-Z-L) $In_{0.22}Ga_{0.78}N$/1.5 nm $Al_{0.2}Ga_{0.8}N$/GaN quantum well with an L value of 0.8 nm and where Z is from 0.5 nm to 2.5 nm are shown in FIG. 18. As can be seen in FIG. 18, as Z increases from 0.5 nm to 2.5 nm, the peak emission wavelength blue shifts from 922 nm to 645 nm.

Figure 19:
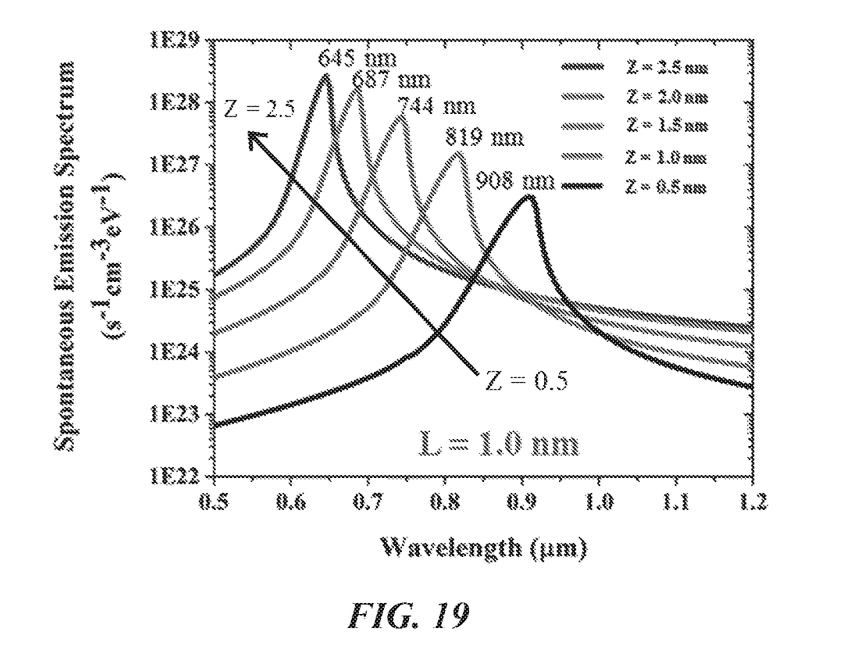
FIG. 19 shows the spontaneous emission spectra for a GaN/Z $In_{0.22}Ga_{0.78}N/L$ $ZnSnN_2(L_{QW}$-Z-L) $In_{0.22}Ga_{0.78}N/$ 1.5 nm $Al_{0.2}Ga_{0.8}N/GaN$ quantum well with an L value of 1.0 nm and where Z is from 0.5 nm to 2.5 nm.

The results for a GaN/Z $In_{0.22}Ga_{0.78}N$/L $ZnSnN_2$/($L_{QW}$-Z-L) $In_{0.22}Ga_{0.78}N$/1.5 nm $Al_{0.2}Ga_{0.8}N$/GaN quantum well with an L value of 1.0 nm and where Z is from 0.5 nm to 2.5 nm are shown in FIG. 19. As can be seen in FIG. 19, as Z increases from 0.5 nm to 2.5 nm, the peak emission wavelength blue shifts from 908 nm to 645 nm.

The results in FIG. 16-FIG. 19 indicate that varying the $ZnSnN_2$ layer position and/or thickness can effectively tune the peak emission wavelength for the proposed IGN/ZTN/AGN quantum wells over a broad wavelength regime with a fixed quantum well thickness ($L_{QW}$) and In content (x).

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The methods of the appended claims are not limited in scope by the specific methods described herein, which are intended as illustrations of a few aspects of the claims and any methods that are functionally equivalent are intended to fall within the scope of the claims. Various modifications of the methods in addition to those shown and described herein are intended to fall within the scope of the appended claims. Further, while only certain representative method steps disclosed herein are specifically described, other combinations of the method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

What is claimed is:

1. A photonic material, comprising:
   a first layer comprising $In_xGa_{1-x}N$, wherein x is from 0 to 0.5;
   a second layer comprising $ZnSnN_2$; and
   a third layer comprising $In_yGa_{1-y}N$, wherein y is from 0 to 0.5;
   wherein the second layer is disposed between and in contact with the first layer and the third layer, such that the second layer is sandwiched between the first layer and the third layer;
   wherein the photonic material has an electron wavefunction with a first confined state and a hole wavefunction with a first confined state, and wherein the overlap of the electron wavefunction and the hole wavefunction in the first confined state in the photonic material is 50% or more; and
   wherein the photonic material has a spontaneous emission spectrum with a peak wavelength of 500 nm or more.

2. The photonic material of claim 1, wherein x and/or y is from 0.05 to 0.5.

3. The photonic material of claim 1, wherein the first layer has a first average thickness of from 0.5 nm to 5 nm.

4. The photonic material of claim 1, wherein the second layer has a second average thickness of from 0.1 nm to 5 nm.

5. The photonic material of claim 1, wherein the third layer has a third average thickness of from 0.3 nm to 5 nm.

6. The photonic material of claim 1, wherein:
the first layer has a first average thickness, the second layer has a second average thickness, and the third layer has a third average thickness; and
the photonic material has an average composite thickness of from 2 nm to 6 nm, wherein the average composite thickness is the sum of the first average thickness, the second average thickness, and the third average thickness.

7. The photonic material of claim 1, further comprising a fourth layer disposed on the third layer, such that the third layer is sandwiched between the second layer and the fourth layer, wherein the fourth layer comprises $Al_zGa_{1-z}N$ and z is from 0.01 to 0.5, and wherein the fourth layer has a fourth average thickness of from 0.2 nm to 4 nm.

8. The photonic material of claim 7, further comprising a fifth layer disposed on the fourth layer, such that the fourth layer is sandwiched between the fifth layer and the third layer, wherein the fifth layer comprises GaN.

9. The photonic material of claim 1, further comprising a sixth layer disposed on the first layer, such that the first layer is sandwiched between the sixth layer and the second layer, wherein the sixth layer comprises GaN.

10. The photonic material of claim 1, wherein the overlap of the electron wavefunction and the hole wavefunction in the first confined state in the photonic material is 60% or more.

11. The photonic material of claim 1, wherein the photonic material has a spontaneous emission spectrum with a peak wavelength of 550 nm or more.

12. The photonic material of claim 1, wherein:
the peak wavelength has an intensity of $1\times10^{26}$ $s^{-1}$ $cm^{-3}$ $eV^{-1}$ or more at a carrier concentration of from $1\times10^{18}$ $cm^{-3}$ to $5\times10^{18}$ $cm^{-3}$;
the photonic material has a spontaneous emission recombination rate per unit volume of $1\times10^{25}$ $s^{-1}$ $cm^{-3}$ or more at a carrier concentration of from $1\times10^{18}$ $cm^{-3}$ to $5\times10^{18}$ $cm^3$;
or a combination thereof.

13. The photonic material of claim 1, wherein:
x and/or y is 0.22; and
the first layer has a first average thickness of from 1.9 nm to 2.1 nm, the second layer has a second average thickness of from 0.9 nm to 1.1 nm, and the third layer has a third average thickness of from 0.9 nm to 1.1 nm.

14. The photonic material of claim 13, wherein:
the overlap of the electron wavefunction and the hole wavefunction in the first confined state in the photonic material is 55% or more; and
the photonic material has a spontaneous emission spectrum with a peak wavelength of from 680 nm to 690 nm.

15. The photonic material of claim 1, wherein:
x and/or y is 0.12; and
the first layer has a first average thickness of from 1.9 nm to 2.1 nm, the second layer has a second average thickness of from 0.6 nm to 0.8 nm, and the third layer has a third average thickness of from 0.7 nm to 0.9 nm.

16. The photonic material of claim 15, wherein:
the overlap of the electron wavefunction and the hole wavefunction in the first confined state in the photonic material is 60% or more; and
the photonic material has a spontaneous emission spectrum with a peak wavelength of from 595 nm to 605 nm.

17. The photonic material of claim 1, wherein:
x and/or y is 0.11; and
the first layer has a first average thickness of from 1.9 nm to 2.1 nm, the second layer has a second average thickness of from 0.3 nm to 0.5 nm, and the third layer has a third average thickness of from 0.4 nm to 0.7 nm.

18. The photonic material of claim 17, wherein:
the overlap of the electron wavefunction and the hole wavefunction in the first confined state in the photonic material is 60% or more; and
the photonic material has a spontaneous emission spectrum with a peak wavelength of from 525 nm to 535 nm.

19. A light emitting diode (LED) comprising a quantum well structure comprising the photonic material of claim 1.

20. A semiconductor laser, a photovoltaic device, a solar cell, or a photodetector comprising the photonic material of claim 1.

* * * * *

UNITED STATES PATENT AND TRADEMARK OFFICE
CERTIFICATE OF CORRECTION

| | |
|---|---|
| PATENT NO. | : 11,355,668 B2 |
| APPLICATION NO. | : 16/763356 |
| DATED | : June 7, 2022 |
| INVENTOR(S) | : Hongping Zhao and Md Rezaul Karim |

It is certified that error appears in the above-identified patent and that said Letters Patent is hereby corrected as shown below:

In the Claims

Claim 12, Column 15, Line 45, delete "$cm^3$;" and insert -- $cm^{-3}$; --.

Signed and Sealed this
Third Day of January, 2023

Katherine Kelly Vidal
*Director of the United States Patent and Trademark Office*